United States Patent
Nordstrom et al.

(10) Patent No.: US 8,896,333 B2
(45) Date of Patent: Nov. 25, 2014

(54) AUTOMATIC TEST EQUIPMENT CONTROL DEVICE

(75) Inventors: Kenny Nordstrom, Phoenix, AZ (US);
Krishna Munirathnam, Karnataka (IN);
Santhoshkumar Ramasamy, Karnataka (IN)

(73) Assignee: Honeywell International Inc., Morristown, NJ (US)

( * ) Notice: Subject to any disclaimer, the term of this patent is extended or adjusted under 35 U.S.C. 154(b) by 223 days.

(21) Appl. No.: 13/475,583

(22) Filed: May 18, 2012

(65) Prior Publication Data

US 2013/0307571 A1     Nov. 21, 2013

(51) Int. Cl.
*G01R 31/308* (2006.01)
*H01H 31/02* (2006.01)
*H01H 9/30* (2006.01)
*G01R 31/28* (2006.01)

(52) U.S. Cl.
CPC ............ *G01R 31/2834* (2013.01); *G01R 31/28* (2013.01)
USPC ................. 324/750.01; 324/750.23; 324/556; 361/11

(58) Field of Classification Search
CPC .............................. G01R 31/2834; G01R 1/28
USPC ........... 324/555, 750.01, 556, 750.23; 361/11
See application file for complete search history.

(56) References Cited

U.S. PATENT DOCUMENTS

| 4,520,416 | A | 5/1985 | Karash |
| 6,768,330 | B2 | 7/2004 | Huang |
| 2002/0119707 | A1* | 8/2002 | Morgan ................. 439/660 |
| 2005/0003266 | A1* | 1/2005 | Wulff ..................... 429/97 |
| 2008/0062603 | A1 | 3/2008 | Richter |
| 2010/0079151 | A1* | 4/2010 | Nordstrom et al. ........ 324/555 |

* cited by examiner

*Primary Examiner* — Melissa Koval
*Assistant Examiner* — Farhana Hoque
(74) *Attorney, Agent, or Firm* — Ingrassia Fisher & Lorenz, P.C.

(57) ABSTRACT

A shutdown apparatus and method for use in conjunction with automatic test equipment (ATE) is provided. A unit under test (UUT) is inserted into an ATE receiver that couples the UUT to at least one electronic device during test and extracted from the ATE receiver after test. The shutdown apparatus comprises an electro-mechanical interface that inserts the UUT into the receiver prior to test and extracts the UUT from the receiver after test A shutdown module is coupled to the electronic device and to the electro-mechanical interface and connects the electronic device to the receiver after insertion of the UUT into the receiver and disconnects the electronic device from the receiver prior to extraction of the UUT from the receiver.

19 Claims, 6 Drawing Sheets

AUTOMATIC TEST EQUIPMENT CONTROL DEVICE

FIELD OF THE INVENTION

Embodiments described herein relate generally to test equipment for electronic systems, and more particularly, to a control device including a shutdown module (SDM) for providing a rapid safety shutdown command to electronic equipment such as multiple AC/DC power supplies or other electronic devices.

BACKGROUND

Automatic test equipment (ATE) refers to automated devices that are widely used in the electronic manufacturing industry to test electronic components and systems after they are fabricated. For example, ATE devices may be used to quickly and efficiently test printed circuit boards, integrated circuits, and other related electronic components or modules including simple components such as resistors, capacitors, and inductors.

The use of ATE to test the digital circuits of a Unit Under Test (UUT) is an important step in the manufacture of such devices. Integrated circuit manufacturers routinely perform functional and parametric testing on integrated circuits by using ATE logic tests to simulate input logic signals at various terminals of the UUT while the ATE monitors the various output signals to determine if they exhibit expected logic patterns. Such systems provide valuable diagnostic functionality testing including the diagnosis and prognosis of aircraft systems and devices such as avionics systems for use on commercial and military aircraft.

When testing such devices by the ATE, it may be necessary to apply different power levels to the UUT. Various power supplies may be required for coupling to specific terminals of the UUT. Furthermore, different UUTs may require different power supplies and/or other electronic devices. Thus, the ATE should be configured so as to provide the various power levels and electronic devices in a safe, simple, and efficient manner including a mechanism for rapidly shutting down the power supplies, electronic devices, and the like. Alternatively or additionally, it may be necessary to couple other electronic devices to specific terminals of the UUT.

BRIEF SUMMARY

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

In accordance with the foregoing, there is provided a shutdown apparatus for automatic test equipment (ATE) of the type wherein a unit under test (UUT) is inserted into an ATE receiver that couples the UUT to at least one electronic device during test and extracted from the ATE receiver after test. The shutdown apparatus comprises an electro-mechanical interface that inserts the UUT into the receiver prior to test and extracts the UUT from the receiver after test, and a shutdown module coupled to the electronic device and to the electro-mechanical interface that couples the electronic device to the receiver after insertion of the UUT into the receiver and disconnects the electronic device from the receiver prior to extraction of the UUT from the receiver.

A shutdown module for automatic test equipment (ATE) is also provided. An electronic device to be tested is inserted into an ATE receiver that enables the UUT to receive power from at least one ATE power supply during test, and the UUT is extracted from the ATE receiver after test. The shutdown apparatus comprises a first connector configured to be coupled to the ATE power supply for enabling and disabling the ATE power supply and a second connector for receiving a first signal indicating that the device is properly engaged with the receiver.

A method for providing power to a unit under test (UUT) to be tested with an ATE is also provided. The ATE which includes at least one electronic device. The UUT is inserted into an ATE receiver that is configured to couple the UUT to the electronic device and, the UUT is extracted from the ATE receiver after test. The method comprises monitoring the position of the UUT as it is inserted into and extracted from the receiver, coupling the electronic device to the receiver when a signal generated by the ATE indicates that the UUT is completely engaged with the receiver, and disconnecting the electronic device from the receiver prior to extraction of the UUT from the receiver.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The following description and claimed subject matter present illustrated embodiments of generic, modular, and scalable automatic test equipment (ATE) station resources. The illustrated embodiments independently validate commercial ATE station resources, yet are configurable for a user to easily modify for differing ATE station configurations (differing resource combinations or number of resources).

The modular design approach seen in the illustrated embodiments reduces engineering effort, uses standard control software architecture, and provides a common method for testing electronic systems. The initial design time is reduced by providing the design engineer with a mechanism for testing an electronic device contained in enclosure housing. The ATE routes the resource signals to a dual data bus back plane that maps the test station stimulus resources to the electronic device to functionally test the device. In one embodiment, the electronic devices comprise custom printed circuit boards. These may take the form factor of a card, and will be referred to herein as device under test (UUT) card modules.

Figure 1:
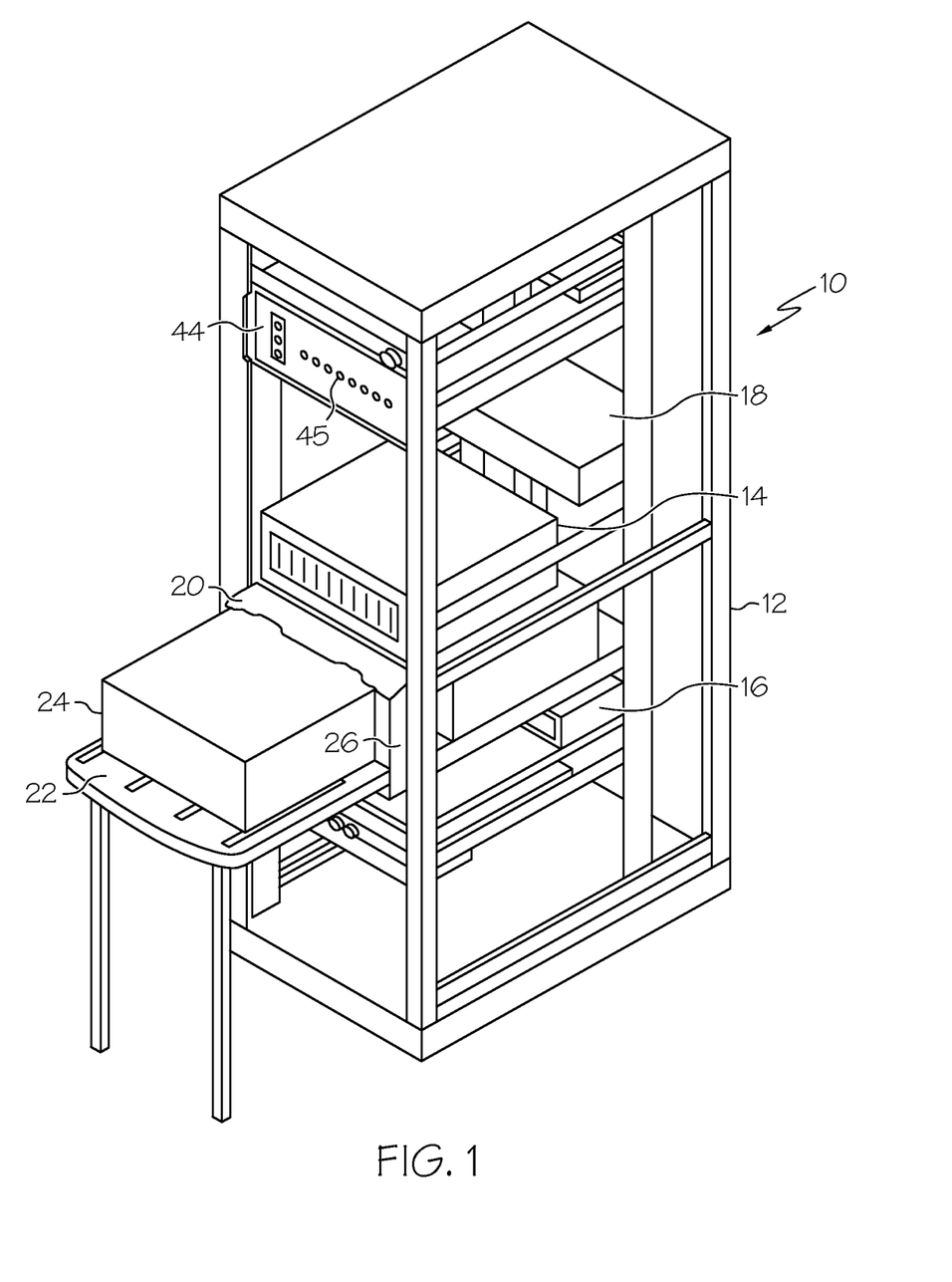
FIG. 1 is an isometric view of an exemplary automatic test equipment (ATE) station in accordance with an embodiment.

FIG. 1 is a rear isometric view of an exemplary automatic test equipment (ATE) station 10 in which various aspects of the previous description and following claimed subject matter may be implemented. Station 10 includes framework or cabinet 12 that houses a computer workstation, server, or similar computer system 14 to provide control, monitoring, and recording of various ATE station 10 resources. ATE station resources 16 and 18 are integrated into the station 10 and are adapted to be in communication with computer workstation 14. The station resources 16 and 18 may vary from implementation to implementation, depending upon the needs of a user. For example, the resources 16 and 18 may include power supplies, power distribution units, or other resources. A receiver 20 provides an interface between the station 10 and a device under test (UUT) 24 which is normally placed on the table 22 and interconnected with the station 10. In the depicted embodiment, UUT 24 is interconnected with the receiver 20. UUT 24 may include one or more UUT modules or cards to be tested by the particular resources implemented in station 10.

As stated previously, it is contemplated that embodiments described herein provide the ability to rapidly transition electronic devices and/or other resources in the ATE to an off and safe condition, if necessary. For illustration purposes only, however, embodiments will be described below wherein the electronic devices include power supplies and external electrical equipment. Thus, the following embodiments relate to a shutdown module (SDM) 44 for controlling the application of power from one or more power supplies to receiver 20 and other equipment. The shutdown module 44 receives an input from an electro-mechanical system via a limit switch (LS) that indicates connector engagement or disengagement. It is also contemplated that the SDM 44 is capable of being housed within a standard industrial enclosure in a standard equipment rack and provides a visual indication of the power output status of the ATE power sources shown at 45 in FIG. 1 and described in more detail in connection with FIG. 6.

Figure 2:
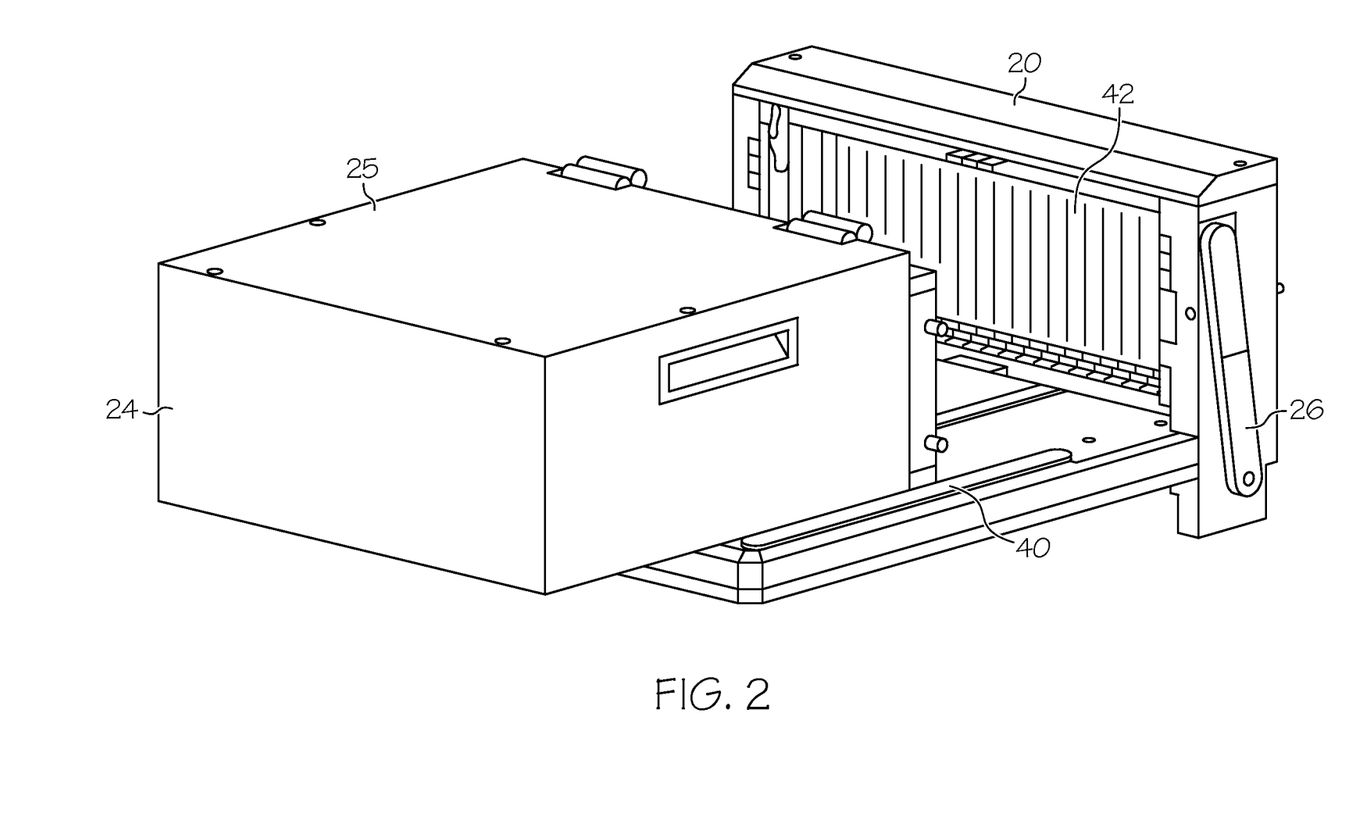
FIG. 2 is an isometric view illustrating a UUT to be tested positioned for insertion into a receiver of the ATE.

FIG. 2 is an isometric view of a UUT in proximity with receiver 20. When a mechanical actuator (e.g. lever 26) is raised to a predetermined location (approximately halfway up), the UUT is drawn into engagement with receiver 20. As lever 26 is further raised, power as applied to the connectors 42 of receiver 20. After the test is complete, lever 26 is lowered causing power to be disconnected from connectors 42 (i.e. when the lever is approximately halfway down) prior to the removal of UUT 24 from contacts 42. Continuing the downward movement of lever 26 causes UUT 24 to disengage from the contacts of receiver 20 (i.e. subsequent to the removal of power from the contacts. As will be shown in connection with FIG. 6, an indicator light on the shutdown module front panel will be illuminated when there is no power to the contacts of receiver 20.

Figure 3:
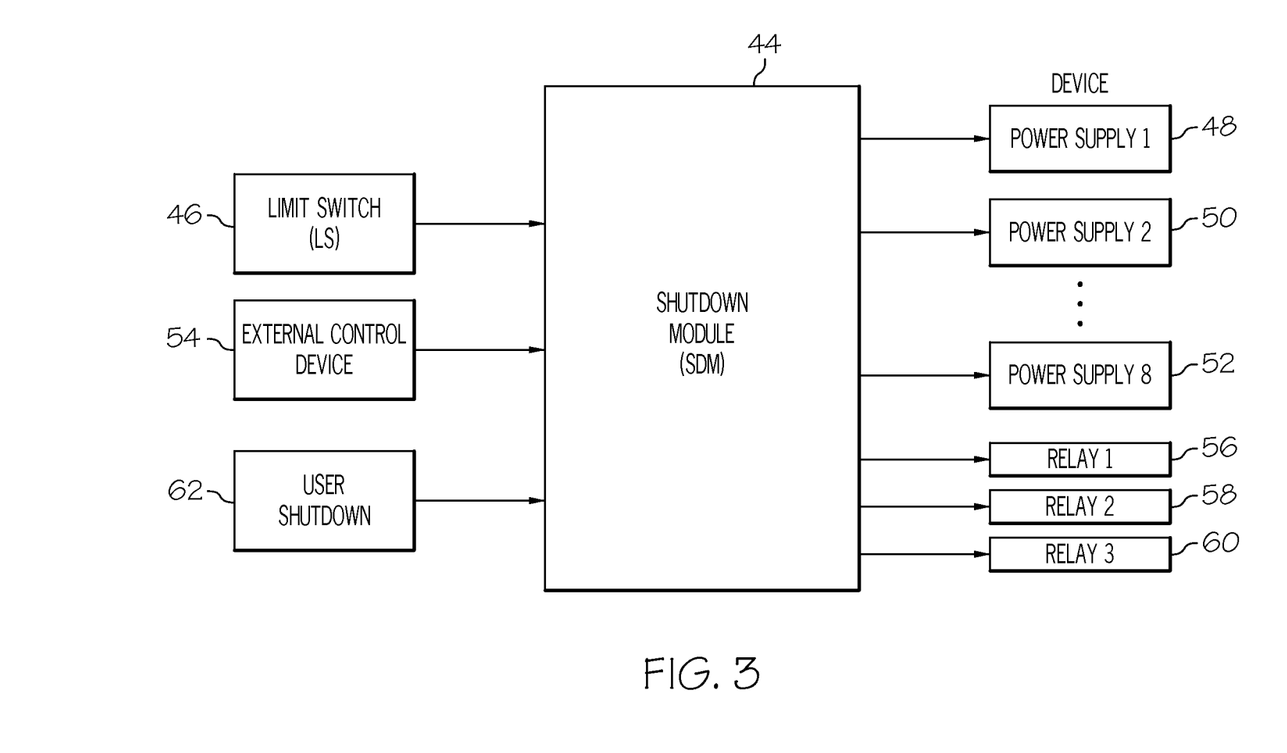
FIG. 3 is a functional block diagram of a shutdown module in accordance with an exemplary embodiment.

FIG. 3 is a block diagram illustrating the inputs to and the outputs from the SDM 44 that provide for the safe and rapid shutdown of the ATE should circumstances merit such a shutdown. In accordance with an embodiment, SDM 44 receives inputs from the LS 46 responsive to the position of lever 26 (FIG. 2) as discussed previously. The SDM is capable of controlling up to eight separate power supplies, only three of which, 48, 50, and 52, are shown for clarity. Thus, all power supplies may be rapidly powered down when lever 26 is lowered approximately half-way as previously described.

In accordance with a further embodiment, an external control device 54 is also provided. It may sometimes be necessary or at least desirable to provide power to a plurality (e.g. three) of external devices 56, 58, and 60 that may be part of the ATE system that would need such shutdown in addition to the power supplies. It is equally desirable, however, to provide a rapid control signal to these external devices along with a rapid shutdown of power to the ATE power supplies. Thus, shutdown module 44 is configured to receive a signal from an external user control device 54 that would activate the logic within the SDM to rapidly shut down up to eight ATE power supplies 48, 50, . . . 52, and, in addition, trigger relays 56, 58, and 60 to shut down any external devices that may be electrically coupled thereto.

Figure 4:
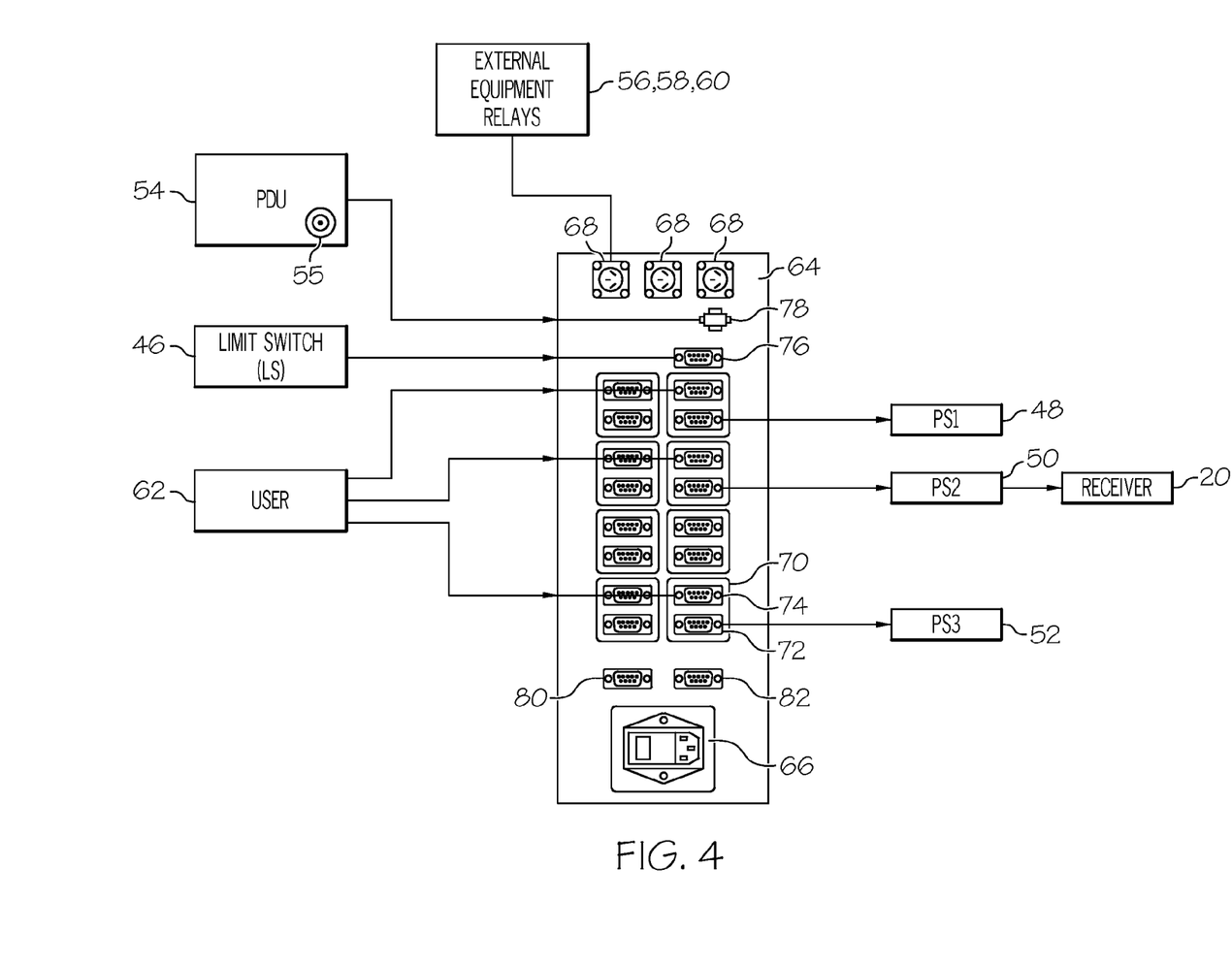
FIG. 4 is a functional block diagram of the shutdown apparatus including a shutdown module in accordance with further exemplary embodiment.

FIG. 4 illustrates the rear panel 64 of SDM 44 in accordance with an exemplary embodiment wherein like elements are denoted by like reference numerals. It comprises a power input socket 66, a plurality of sockets 68 (e.g. three) to which external equipment relays 56, 58, and 60 may be electrically coupled, a plurality of pairs of connectors 70 (e.g. eight), each comprising a first connector 72 for enabling and disabling one of the power supplies 48, 50, and 52 (FIG. 3) housed within ATE 10 and a second connector 74 (a user control plug (FIG. 1)) for receiving a signal that an individual ATE power supply 72 is to be disabled at the discretion of the ATE user 62 (FIG. 3). In addition, a connector 76 is provided for coupling to LS 46, and connector 78 is provided for coupling to external user control device 55 that may be included on a power distribution unit (PDU) 54 (housed in ATE cabinet 12). In addition, master and slave connectors, 80 and 82 respectively, are provided to permit a number of shutdown modules to be coupled in series without the need for externally coupling the LS switch and the external user control device to each one.

Figure 5:
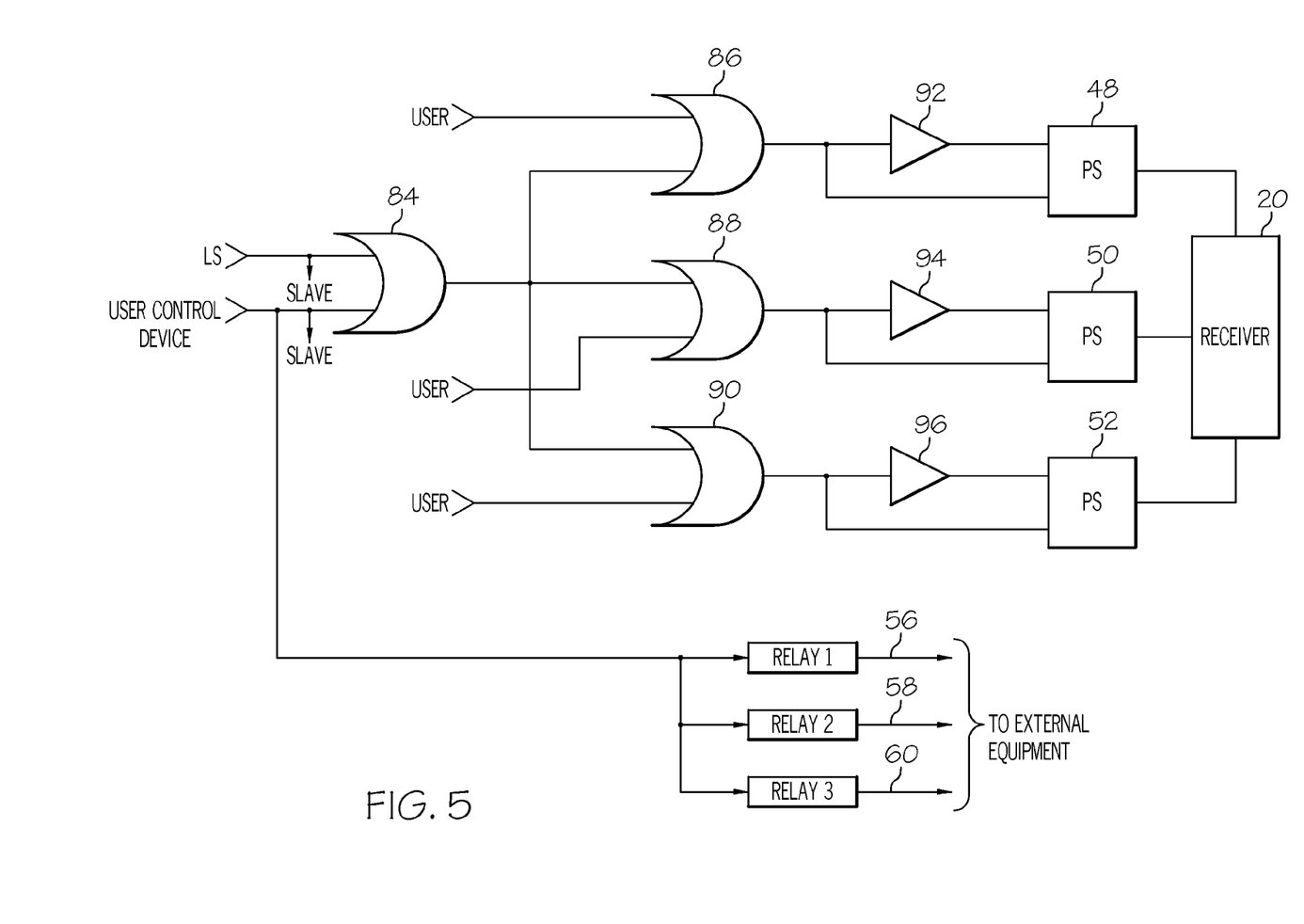
FIG. 5 is an exemplary logic diagram illustrating the operation of a shutdown apparatus of the type shown in FIGS. 3 and 4.

The operation of SDM 44 will be further described in connection with FIG. 5 which is a functional logic diagram illustrating its operation in accordance with an embodiment. As can be seen, a user shutdown signal is provided to a first input of each of OR-functions 86, 88, and 90. The outputs of OR-functions 86, 88, and 90 are provided directly to power supplies 48, 50, and 52, respectively. The inverted outputs of OR-functions 86, 88 and 90 are also provided to power supplies 48, 50, and 52 respectively via inverters 92, 94, and 96. In this manner, one or more power supplies may be turned off by a user of the ATE as previously described. In addition, OR-function 84 has a first input coupled to receive a LS signal from lever mechanism 26 and a second input coupled to receive an external user control signal from PDU 54. The output of OR-function 84 is applied to a second input of OR-functions 86, 88, and 90, which are, in turn, applied to inverted and non-inverted inputs of each of power supplies 48, 50, and 52 to provide the appropriate logic signal to control the power supply output power. The output of OR-function 88 may also be applied in a similar manner to any or all of an additional five power supplies (not shown) since the SDM can accommodate up to eight power supplies as described in connection with FIG. 4. In addition to turning the power supplies off, the user control signal is also provided to any auxiliary equipment by triggering relays 56, 58, and/or 60 (FIG. 3). Finally, the SDM 44 includes a master plug 80 and a slave plug 82 to permit the daisy-charging of SDMs as previously described. While FIG. 5 has been described in connection with OR-functions, it should be appreciated that this is an exemplary implementation, and that various logic functions and circuitry may be utilized to obtain the desired result.

Figure 6:
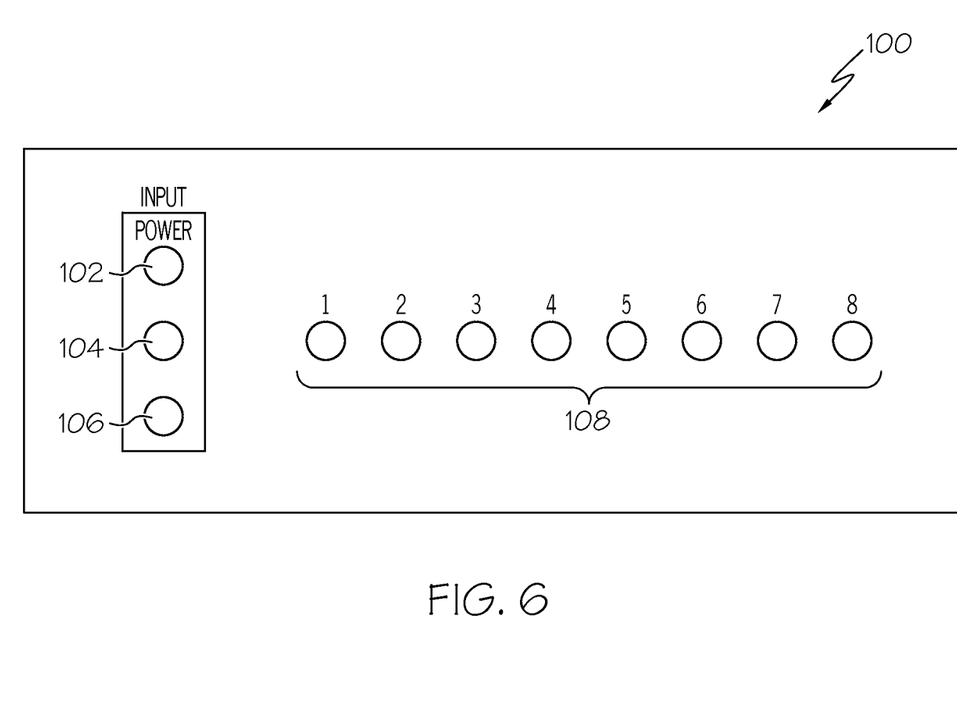
FIG. 6 illustrates a front panel of a shutdown module in accordance with an embodiment.

FIG. 6 illustrates an exemplary front panel 100 of a shutdown module in accordance with the foregoing. As can be seen, a visual indicator 102 illuminates when the shutdown module is on. Visual indicator 104, when illuminated, indicates that an external user control device signal has been generated, and visual indicator 106, when illuminated, indicates that the UUT 20 is coupled to the ATE receiver. Finally, visual indicators 108, when illuminated, indicate which, if any, of the eight power supply outputs are disabled.

While at least one exemplary embodiment has been presented in the foregoing detailed description, it should be appreciated that a vast number of variations exist. For example, the techniques and methodologies presented here could also be deployed as part of a fully automated guidance system to allow the flight crew to monitor and visualize the execution of automated maneuvers. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A shutdown apparatus for automatic test equipment (ATE) of the type wherein a unit under test (UUT) is inserted into an ATE receiver that couples the UUT to at least one electronic device during test, and wherein the UUT is extracted from the ATE receiver after test, the shutdown apparatus comprising:
    an electro-mechanical interface that inserts the UUT into the receiver prior to test and extracts the UUT from the receiver after test, the electro-mechanical device includes a mechanical actuator coupled to the ATE and capable of being moved between first and second positions; and
    a shutdown module coupled to the electronic device and to the electro-mechanical interface that, in response to the position of the mechanical actuator, couples the electronic device to the receiver after insertion of the UUT into the receiver and disconnects the electronic device from the receiver prior to extraction of the UUT from the receiver.

2. A shutdown apparatus according to claim 1 wherein the electro-mechanical interface comprises:
    a detector coupled to the shutdown module for signaling that the mechanical actuator has reached a predetermined location between the first and second positions.

3. A shutdown apparatus according to claim 2 wherein the mechanical actuator is a lever.

4. A shutdown apparatus according to claim 3 wherein the electro-mechanical interface includes a limit switch that detects the position of the device during engagement of the UUT into the receiver and disengagement of the UUT from the receiver.

5. A shutdown apparatus according to claim 2 wherein the electronic device is a power supply and wherein the shutdown module applies power from the power supply to the receiver after insertion of the UUT into the receiver and removes power from the power supply to the receiver prior to extraction of the UUT from the receiver.

6. A shutdown apparatus according to claim 5 wherein the shutdown module comprises an indicator for indicating to a user that output power from the power supply is applied to the receiver.

7. A shutdown module for automatic test equipment (ATE) of the type wherein an electronic device to be tested is inserted into an ATE receiver that enables the UUT to receive power from at least one ATE power supply during test, and wherein the UUT is extracted from the ATE receiver after test, the shutdown apparatus comprising:
    a first connector configured to be coupled to the ATE power supply for enabling and disabling the ATE power supply;
    a second connector for receiving a first signal indicating that the device is properly engaged with the receiver; and
    a third connector configured for receiving a rapid shutdown signal from a user control signal device on the ATE when the rapid shutdown signal is activated.

8. A shutdown module according to claim 7 wherein the ATE includes a first plurality of power supplies and further comprising a first plurality of connectors, each one configured to be coupled to one of the plurality of power supplies for enabling the plurality of power supplies to provide power to the receiver in response to the first signal.

9. A shutdown module according to claim 7 further comprising a second plurality of connectors configured to be coupled to the ATE by means of which an ATE user may selectively enable and disable the least one of the first plurality of power supplies to the receiver.

10. A shutdown module according to claim 9 further comprising circuitry including a fourth plurality of connectors each one configured to be coupled to one of a plurality of relays for turning off equipment external to the ATE.

11. A shutdown module according to claim 10 further comprising circuitry for removing power from the first plurality of power supplies to the receiver and removing power to the equipment coupled to the ATE in response to the rapid shutdown signal.

12. A shutdown module according to claim 7 further comprising master/slave circuitry and connectors to enable daisy-chaining a plurality of shutdown modules.

13. A method for providing power to a unit under test (UUT) to be tested with ATE of the type which includes at least one electronic device and wherein the UUT is inserted into an ATE receiver that is configured to couple the UUT to the electronic device, and wherein the UUT is extracted from the ATE receiver after test, the method comprising:
monitoring the position of the UUT as it is inserted into and extracted from the receiver;
coupling the electronic device to the receiver in response to a position of a mechanical actuator and when a signal generated by the ATE indicates that the UUT is completely engaged with the receiver; and
disconnecting the electronic device from the receiver in response to a position of the mechanical actuator and prior to extraction of the UUT from the receiver.

14. A method according to claim 13 wherein the electronic device is a power supply and further comprising:
applying power to the receiver when a signal generated by the ATE indicates that the UUT is completely engaged with the receiver; and
disconnecting power to the receiver prior to extraction of the UUT from the receiver.

15. A method according to claim 14 further comprising:
moving a mechanical actuator on the ATE between first and second positions to insert and extract respectively the UUT from the receiver;
monitoring the position of the UUT with respect to the receiver;
sending a signal to the shutdown module when the mechanical actuator has reached a predetermined location between the first and second positions.

16. A method according to claim 14 further comprising displaying the status of a plurality of ATE power supplies on the shutdown module.

17. A method according to claim 16 further comprising selectively disconnecting power from the receiver by means of user controls on the ATE.

18. A method according to claim 14 further comprising coupling power from the power supply to external equipment via the shutdown module.

19. A method according to claim 18 further comprising activating a user control device to remove power from the receiver and the external equipment.

* * * * *